(12) United States Patent
Shimada et al.

(10) Patent No.: US 11,955,582 B2
(45) Date of Patent: Apr. 9, 2024

(54) LIGHT EMITTING APPARATUS AND PROJECTOR

(71) Applicants: Seiko Epson Corporation, Tokyo (JP); Sophia School Corporation, Tokyo (JP)

(72) Inventors: Hiroyuki Shimada, Chuo (JP); Katsumi Kishino, Akiruno (JP)

(73) Assignees: SEIKO EPSON CORPORATION (JP); SOPHIA SCHOOL CORPORATION (JP)

( * ) Notice: Subject to any disclaimer, the term of this patent is extended or adjusted under 35 U.S.C. 154(b) by 352 days.

(21) Appl. No.: 17/186,080

(22) Filed: Feb. 26, 2021

(65) Prior Publication Data
US 2021/0273135 A1   Sep. 2, 2021

(30) Foreign Application Priority Data
Feb. 27, 2020   (JP) ................. 2020-031339

(51) Int. Cl.
| | | |
|---|---|---|
| H01L 33/32 | (2010.01) | |
| G03B 21/20 | (2006.01) | |
| H01L 33/38 | (2010.01) | |
| H01L 33/54 | (2010.01) | |

(52) U.S. Cl.
CPC .......... H01L 33/32 (2013.01); G03B 21/2033 (2013.01); H01L 33/38 (2013.01); H01L 33/54 (2013.01)

(58) Field of Classification Search
CPC ......... H01L 33/32; H01L 33/38; H01L 33/54; H01L 33/08; G03B 21/2033
See application file for complete search history.

(56) References Cited

U.S. PATENT DOCUMENTS

| | | | |
|---|---|---|---|
| 2007/0248132 A1 | 10/2007 | Kikuchi et al. | |
| 2013/0092900 A1* | 4/2013 | Lowgren | H01L 33/405 |
| | | | 257/13 |
| 2018/0069154 A1* | 3/2018 | Dobrinsky | H01L 31/1852 |
| 2020/0274330 A1 | 8/2020 | Nagawa et al. | |

FOREIGN PATENT DOCUMENTS

| | | |
|---|---|---|
| JP | 2007-049062 A | 2/2007 |
| JP | 2018-133517 A | 8/2018 |
| JP | 2019-054127 A | 4/2019 |
| WO | 2006-025407 A1 | 3/2006 |

* cited by examiner

*Primary Examiner* — Su C Kim
(74) *Attorney, Agent, or Firm* — Harness, Dickey & Pierce, P.L.C.

(57) ABSTRACT

A light emitting apparatus includes a substrate, a laminated structure provided at the substrate and including a plurality of columnar sections, and an electrode provided on the side opposite the substrate with respect to the laminated structure and injecting current into the laminated structure. The columnar sections each include an n-type first GaN layer, a p-type second GaN layer, and a light emitting layer provided between the first GaN layer and the second GaN layer. The first GaN layers are provided between the light emitting layers and the substrate. The laminated structure includes a p-type first AlGaN layer. The first AlGaN layer includes a first section provided between the second GaN layers of the columnar sections adjacent to each other and a second section provided between the first section and the electrode and between the columnar sections and the electrode.

6 Claims, 3 Drawing Sheets

LIGHT EMITTING APPARATUS AND PROJECTOR

The present application is based on, and claims priority from JP Application Serial Number 2020-031339, filed Feb. 27, 2020, the disclosure of which is hereby incorporated by reference herein in its entirety.

BACKGROUND

1. Technical Field

The present disclosure relates to a light emitting apparatus and a projector.

2. Related Art

Semiconductor lasers are expected as a high-luminance, next-generation light source. In particular, a semiconductor laser having a nano-structure called, for example, a nano-column, a nano-wire, a nano-rod, and a nano-pillar, is expected to achieve a light emitting apparatus capable of emitting high-power light having a narrow radiation angle based on a photonic crystal effect.

For example, JP-A-2007-49062 describes a light emitting diode formed by forming an n-type GaN nano-column layer and a light emitting layer on a silicon substrate, epitaxially growing a p-type GaN contact layer while causing the diameter of the nano-columns to increase, and forming a semitransparent p-type electrode on the p-type GaN contact layer.

In JP-A-2007-49062, however, the p-type GaN layer is grown while the diameter of the nano-columns increases, and the p-type GaN layer forms one layer continuous over a plurality of columnar sections. Since the one continuous layer has no air gap, the layer has a high average refractive index in the in-plane direction. It is therefore difficult to confine light in the light emitting layer, so that the light produced in the light emitting layer leaks toward the electrode and absorbed by the electrode, resulting in optical loss in some cases.

SUMMARY

An aspect of a light emitting apparatus according to the present disclosure includes a substrate, a laminated structure provided at the substrate and including a plurality of columnar sections, and an electrode provided on a side opposite the substrate with respect to the laminated structure and injecting current into the laminated structure. The columnar sections each include an n-type first GaN layer, a p-type second GaN layer, and a light emitting layer provided between the first GaN layer and the second GaN layer. The first GaN layers are provided between the light emitting layers and the substrate. The laminated structure includes a p-type first AlGaN layer. The first AlGaN layer includes a first section provided between the second GaN layers of the columnar sections adjacent to each other and a second section provided between the first section and the electrode and between the columnar sections and the electrode.

An aspect of a projector according to the present disclosure has the aspect of the light emitting apparatus.

DESCRIPTION OF EXEMPLARY EMBODIMENTS

A preferable embodiment of the present disclosure will be described below in detail with reference to the drawings. It is not intended that the embodiment described below unduly limits the contents of the present disclosure set forth in the appended claims. Further, all configurations described below are not necessarily essential configuration requirements of the present disclosure.

1. Light Emitting Apparatus

Figure 1:
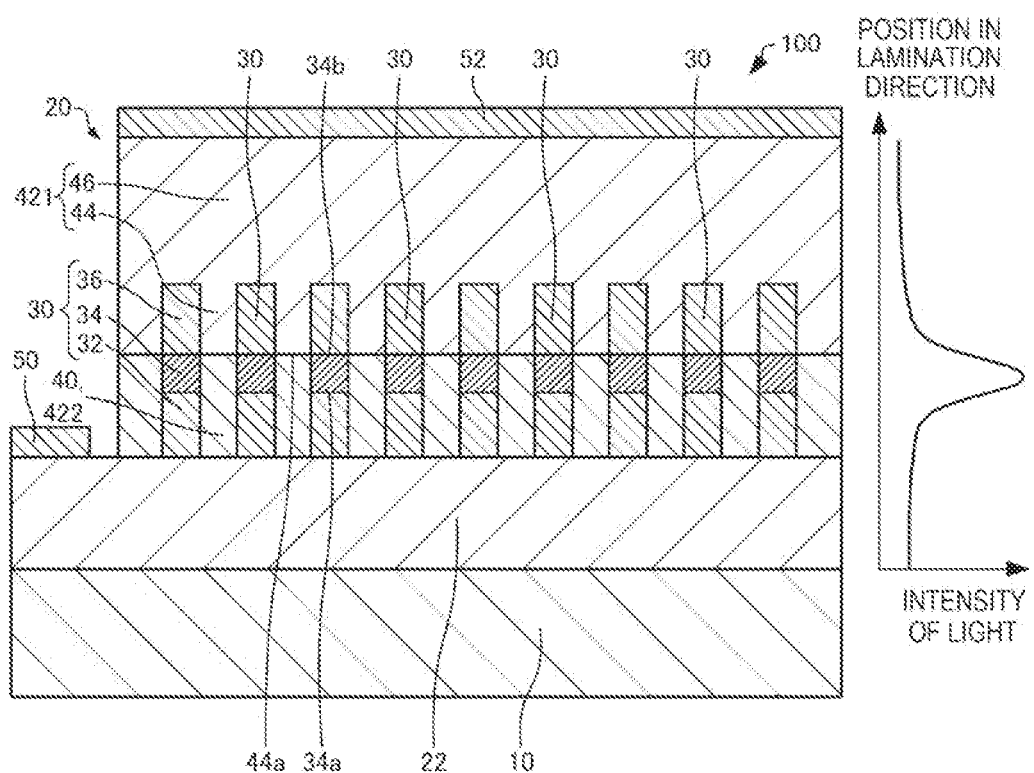
FIG. 1 is a cross-sectional view diagrammatically showing a light emitting apparatus according to an embodiment of the present disclosure.

A light emitting apparatus according to the present embodiment will first be described with reference to the drawings. FIG. 1 is a cross-sectional view diagrammatically showing a light emitting apparatus 100 according to the present embodiment.

The light emitting apparatus 100 includes, for example, a substrate 10, a laminated structure 20, a first electrode 50, and a second electrode 52, as shown in FIG. 1.

The substrate 10 has, for example, a plate-like shape. The substrate 10 is, for example, an Si substrate, a GaN substrate, or a sapphire substrate.

The laminated structure 20 is provided at the substrate 10. In the example shown in FIG. 1, the laminated structure 20 is provided on the substrate 10. The laminated structure 20 includes, for example, a buffer layer 22, columnar sections 30, a low refractive index section 40, and a first AlGaN layer 421.

The present specification will be described on the assumption that in a lamination direction in which a first GaN layer 32 and a light emitting layer 34 are laminated on each other (hereinafter also simply referred to as "lamination direction"), the direction from the light emitting layer 34 as a reference toward a second GaN layer 36 is called an "upward direction" and the direction from the light emitting layer 34 as the reference toward the first GaN layer 32 is called a "downward direction." The direction perpendicular to the lamination direction is also called an "in-plane direction."

The buffer layer 22 is provided on the substrate 10. The buffer layer 22 is, for example, an n-type GaN layer to which Si has been doped. Although not shown, a mask layer for growing the columnar sections 30 may be provided on the buffer layer. The mask layer is, for example, a silicon oxide layer, a titanium layer, a titanium oxide layer, or an aluminum oxide layer.

The columnar sections 30 are provided on the buffer layer 22. The columnar sections 30 each have a columnar shape protruding upward from the buffer layer 22. The columnar sections 30 are each also called, for example, a nano-column, a nano-wire, a nano-rod, and a nano-pillar. The columnar sections 30 each have, for example, a regular hexagonal planar shape or any other polygonal planar shape or a circular planar shape.

The columnar sections 30 each have a diameter, for example, greater than or equal to 50 nm but smaller than or equal to 500 nm. When the diameter of the columnar sections 30 is smaller than or equal to 500 nm, a high-quality crystal light emitting layer 34 can be produced, and distortion intrinsically present in the light emitting layer 34 can be reduced. The light produced in the light emitting layer 34 can thus be amplified at high efficiency. The plurality of columnar sections 30 have, for example, the same diameter.

In a case where the columnar sections 30 each have a circular planar shape, the term "the diameter of the columnar sections" refers to the diameter of the circular shape, and when the columnar sections 30 each have a non-circular planar shape, the term refers to the diameter of a minimum circle containing the non-circular shape therein. For example, when the columnar sections 30 each have a polygonal planar shape, the diameter of the columnar sections 30 is the diameter of a minimum circle containing the polygonal shape therein, and when the columnar sections 30 each have an elliptical planar shape, the diameter is the diameter of a minimum circle containing the elliptical shape therein.

The columnar sections 30 are located at a plurality of locations. The distance between adjacent columnar sections 30 is, for example, greater than or equal to 1 nm but smaller than or equal to 500 nm. The plurality of columnar sections 30 are arranged in a predetermined direction at predetermined intervals in the plan view in the lamination direction (hereinafter also simply referred to as "in the plan view"). The plurality of columnar sections 30 are arranged in a triangular lattice. The plurality of columnar sections 30 are not necessarily arranged in a specific shape and may be arranged in a square lattice. The plurality of columnar sections 30 can express a photonic crystal effect.

The "interval between the columnar sections" is the distance between the centers of columnar sections 30 adjacent to each other in the predetermined direction. In the case where the columnar sections 30 each have a circular planar shape, the term "the centers of the columnar sections" each refer to the center of the circle, and when the columnar sections 30 each have a non-circular planar shape, the term refers to the center of a minimum circle containing the non-circular shape therein. For example, when the columnar sections 30 each have a polygonal planar shape, the center of each of the columnar sections is the center of a minimum circle containing the polygonal shape therein, and when the columnar sections 30 each have an elliptical planar shape, the center is the center of a minimum circle containing the elliptical shape therein.

The columnar sections 30 each include the first GaN layer 32, the light emitting layer 34, the second GaN layer 36.

The first GaN layer 32 is provided on the buffer layer 22. The first GaN layer 32 is provided between the substrate 10 and the light emitting layer 34. The first GaN layer 32 is an n-type semiconductor layer. The first GaN layer 32 is, for example, an n-type GaN layer to which Si has been doped.

The light emitting layer 34 is provided on the first GaN layer 32. The light emitting layer 34 is provided between the first GaN layer 32 and the second GaN layer 36. The light emitting layer 34 produces light when current is injected thereinto. The light emitting layer 34 has, for example, a multiple quantum well structure in which quantum well structures each formed of a u-type (unintentionally-doped) GaN layer, to which no impurity has been intentionally doped, and a u-type InGaN layer are layered on each other. The GaN layer and the InGaN layer that form the light emitting layer 34 may each be an i-type (intrinsic-semiconductor-type) semiconductor layer.

The second GaN layer 36 is provided on the light emitting layer 34. The second GaN layer 36 is a p-type semiconductor layer. The second GaN layer 36 is, for example, a p-type GaN layer to which Mg has been doped. The first GaN layer 32 and the second GaN layer 36 are each a cladding layer having the function of confining the light in the light emitting layer 34.

The low refractive index section 40 is provided between the first GaN layers 32 of adjacent columnar sections 30. In the example shown in FIG. 1, the low refractive index section 40 is also provided between the light emitting layers 34 of adjacent columnar sections 30. The low refractive index section 40, for example, surrounds the columnar sections 30 in the plan view. The refractive index of the low refractive index section 40 is lower than the refractive index of the first GaN layers 32 and the refractive index of the second GaN layers 36. The low refractive index section 40 is an AlGaN layer. The low refractive index section 40 is, for example, a u-type second AlGaN layer 422. The first GaN layers 32 and the second GaN layers 36 can thus be isolated from each other. The second AlGaN layer 422 may instead be an i-type AlGaN layer.

The first AlGaN layer 421 is provided between the substrate 10 and the second electrode 52. The first AlGaN layer 421 includes a first section 44 and a second section 46.

The first section 44 of the first AlGaN layer 421 is provided between the second GaN layers 36 of adjacent columnar sections 30. The first section 44, for example, surrounds the columnar sections 30 in the plan view. The first section 44 is provided on the low refractive index section 40. In the example shown in FIG. 1, an end 44a of the first section 44, which is the end facing the substrate 10, is located in a position shifted from an end 34a of each of the light emitting layers 34, which is the end facing the substrate 10, toward the second electrode 52 in the lamination direction. In the lamination direction, the end 44a of the first section 44, which is the end facing the substrate 10, coincides with an end 34b of each of the light emitting layers 34, which is the end facing the second electrode 52, in the lamination direction.

The second section 46 of the first AlGaN layer 421 is provided between the first section 44 and the second electrode 52 and between the columnar seconds 30 and the second electrode 52. The second section 46 is provided on the first section 44 and the second GaN layers 36. The second section 46 is provided integrally with the first section 44. In the example shown in FIG. 1, the second section 46 is thicker than the first section 44.

The first AlGaN layer 421 is a p-type semiconductor layer. The first AlGaN layer 421 is, for example, a p-type AlGaN layer to which Mg has been doped. The refractive index of the first AlGaN layer 421 is lower than the refractive index of the first GaN layers 32 and the refractive index of the second GaN layers 36. Assuming that the first AlGaN layer 421 is made of $Al_xGa_{1-x}N$, x satisfies, for example, $0.10 \leq x \leq 0.20$. When x is greater than or equal to 0.10, the refractive index of the first AlGaN layer 421 can be lowered. When x is smaller than or equal to 0.20, the electrical conductivity of the first AlGaN layer 421 can be increased, whereby the efficiency of the current injection into the light emitting layers 34 can be increased.

The first electrode 50 is provided on the buffer layer 22. The buffer layer 22 may be in ohmic contact with the first electrode 50. The first electrode 50 is electrically coupled to the first GaN layers 32. In the example shown in FIG. 1, the first electrode 50 is electrically coupled to the first GaN layers 32 via the buffer layer 22. The first electrode 50 is one of the electrodes for injecting the current into the light emitting layers 34. The first electrode 50 is, for example, a laminated structure of a Cr layer, an Ni layer, and an Au layer laminated in the presented order from the side facing the buffer layer 22.

The second electrode 52 is provided on the side opposite the substrate 10 with respect to the laminated structure 20. In the example shown in FIG. 1, the second electrode 52 is provided on the second section 46 of the first AlGaN layer 421. The second electrode 52 can therefore be highly flat. The second electrode 52 is electrically coupled to the second GaN layers 36. In the example shown in FIG. 1, the second electrode 52 is electrically coupled to the second GaN layers 36 via the first AlGaN layer 421. The second electrode 52 is the other one of the electrodes for injecting the current into the light emitting layers 34. The second electrode 52 is made, for example, of an indium tin oxide (ITO).

In the light emitting apparatus 100, each set of the p-type second GaN layer 36, the light emitting layer 34, and the n-type first GaN layer 32 form a pin diode. In the light emitting apparatus 100, when forward bias voltage for the pin diode is applied to the space between the first electrode 50 and the second electrode 52, current is injected into the light emitting layers 34, whereby electrons and holes recombine with each other in the light emitting layers 34. The recombination causes light emission. The first GaN layer 32 and the second GaN layer 36 cause the light produced in the light emitting layers 34 to propagate in the low refractive index section 40 in the in-plane direction and form a standing wave based on the photonic crystal effect provided by the plurality of columnar sections 30, and the standing wave receives gain in the light emitting layer 34 to achieve laser oscillation. The light emitting apparatus 100 then outputs positive first order diffracted light and negative first order diffracted light as the laser light in the lamination direction.

The above description has been made of the InGaN-based light emitting layers 34, and the light emitting layers 34 can be made, in accordance with the wavelength of the outputted light, of any of a variety of other materials capable of light emission when current is injected thereinto. Examples of the material of the light emitting layers 34 may include an AlGaN-based, AlGaAs-based, InGaAs-based, InGaAsP-based, In—P-based, GaP-based, and AlGaP-based semiconductor materials.

The light emitting apparatus 100 provides, for example, the following effects and advantages.

In the light emitting apparatus 100, the laminated structure 20 includes the p-type first AlGaN layer 421, and the first AlGaN layer 421 includes the first section 44, which is provided between the second GaN layers 36 of adjacent columnar sections 30, and the second section 46, which is provided between the first section 44 and the second electrode 52 and between the columnar sections 30 and the second electrode 52. The refractive index of an AlGaN layer is lower than the refractive index of a GaN layer. Therefore, in the light emitting apparatus 100, the average refractive index of the second section 46 in the in-plane direction can be lowered as compared with a case where the second section is a GaN layer. Therefore, when the light produced in the light emitting layers 34 propagates in the in-plane direction, the peak of the intensity of the light is allowed to coincide with the position of the light emitting layers 34, as shown in FIG. 1.

Figure 2:
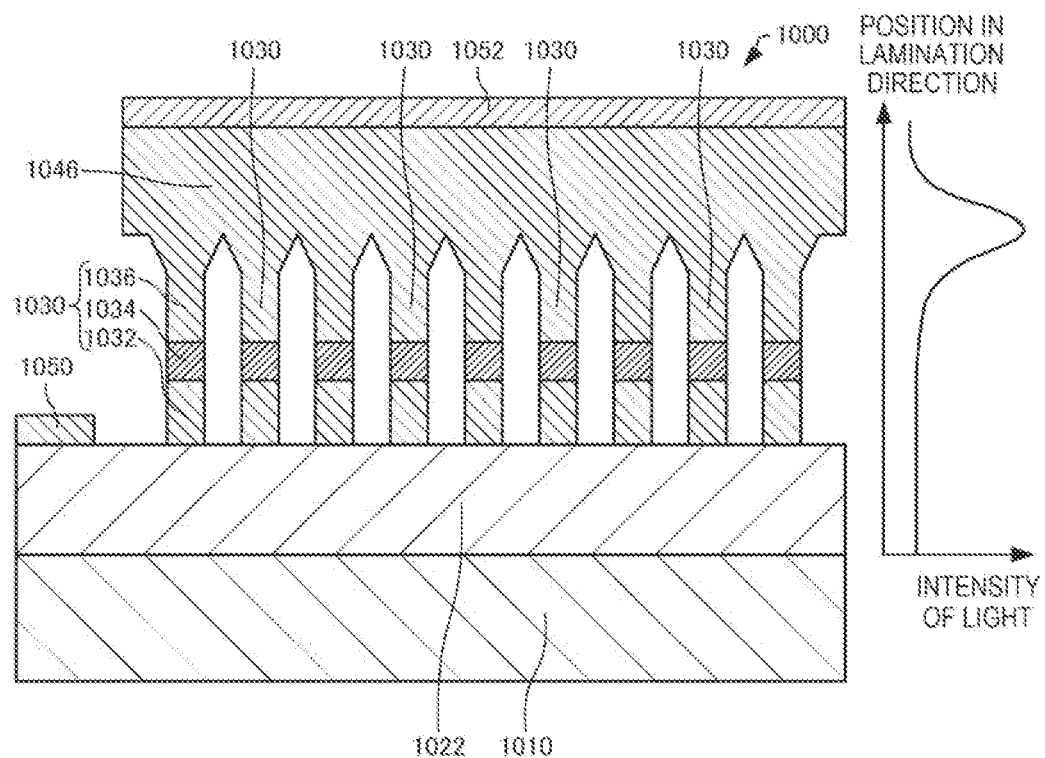
FIG. 2 is a cross-sectional view diagrammatically showing a light emitting apparatus according to Reference Example.

For example, as shown in FIG. 2, when a p-type second GaN layer 1036 grows while the diameter of the nano-columns increases, and the second GaN layer 1036 includes a section 1046, which forms a single layer continuous over a plurality of columnar sections 1030, the section 1046 has no air gap, so that the section 1046 has a high average refractive index in the in-plane direction. The peak of the intensity of the light therefore shifts toward the second electrode 1052, as shown in FIG. 2.

As described above, in the light emitting apparatus 100, the light can be confined in the light emitting layers 34, as compared with a light emitting apparatus 1000. The light emitting apparatus 100 can therefore reduce the amount of lost light that leaks toward the second electrode 52 and is absorbed by the second electrode 52.

FIG. 2 is a cross-sectional view diagrammatically showing the light emitting apparatus 1000 according to Reference Example. The light emitting apparatus 1000 includes a substrate 1010, a buffer layer 1022, the columnar sections 1030, a first electrode 1050, and a second electrode 1052, as shown in FIG. 2. The columnar sections 1030 each include a first GaN layer 1032, a light emitting layer 1034, the second GaN layer 1036.

Further, in the light emitting apparatus 100, the efficiency of the current injection into the light emitting layers 34 can be increased as compared with a case where no p-type AlGaN layer is provided so that an air gap is present between the second GaN layers of adjacent columnar sections.

In the light emitting apparatus 100, the laminated structure 20 includes the low refractive index section 40, the refractive index of which is lower than that of the first GaN layers 32, between the first GaN layers 32 of adjacent columnar sections 30. Therefore, in the light emitting apparatus 100, the average refractive index of the first GaN layers 32 in the in-plane direction can be lowered as compared with a case where a layer having a refractive index equal to the refractive index of the first GaN layers is provided between the first GaN layers of adjacent columnar sections.

In the light emitting apparatus 100, the low refractive index section 40 is the second AlGaN layer 422. Therefore, in the light emitting apparatus 100, the first AlGaN layer 421 can be grown, for example, only by, after the growth of the low refractive index section 40, switching a gas to another and doping Mg, which is an impurity, into the first AlGaN layer 421. The second AlGaN layer 422, which is the low refractive index section 40, and the first AlGaN layer 421 can be successively grown in a single apparatus, whereby the second AlGaN layer 422, which is the low refractive index section 40, and the first AlGaN layer 421 can be readily formed. Assuming that the second AlGaN layer 422 is made of $Al_yGa_{1-y}N$, x and y are, for example, equal to each other.

Further, when the low refractive index section 40 is an AlGaN layer, the low refractive index section 40 can be formed by lateral growth from the columnar sections 30. The gap between adjacent columnar sections 30 can therefore be filled even when the distance between the adjacent columnar sections 30 is small.

2. Method for Manufacturing Light Emitting Apparatus

Figure 3:
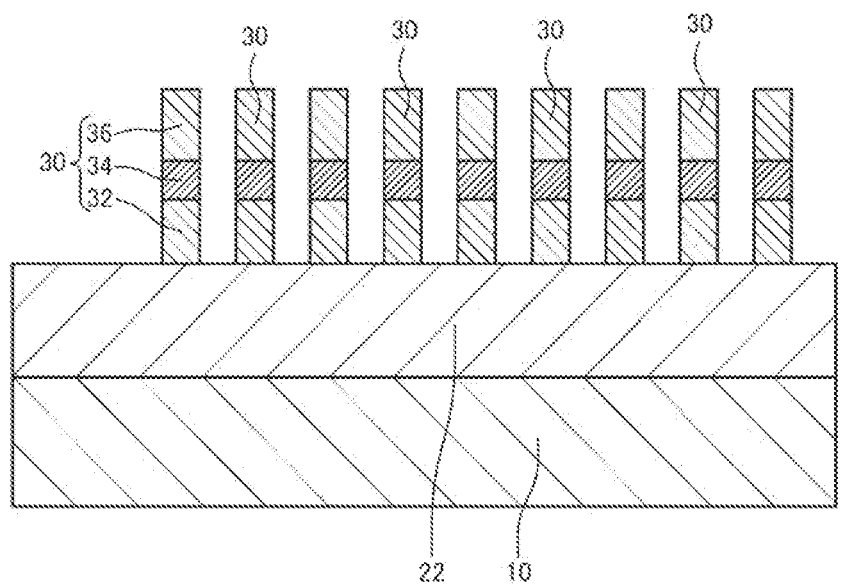
FIG. 3 is a cross-sectional view diagrammatically showing one of the steps of manufacturing the light emitting apparatus according to the present embodiment.

A method for manufacturing the light emitting apparatus 100 according to the present embodiment will next be described with reference to the drawings. FIG. 3 is a cross-sectional view diagrammatically showing one of the steps of manufacturing the light emitting apparatus 100 according to the present embodiment.

The buffer layer 22 is epitaxially grown on the substrate 10, as shown in FIG. 3. Examples of the epitaxial growth method may include a metal organic chemical vapor deposition (MOCVD) method and a molecular beam epitaxy (MBE) method.

A mask layer that is not shown is then formed on the buffer layer 22. The first GaN layers 32, the light emitting layers 34, and the second GaN layers 36 are then epitaxially grown on the buffer layer 22 with the mask layer serving as a mask. Examples of the epitaxial growth method may include the MOCVD and MBE methods. The columnar sections 30 can thus be formed. The first GaN layers 32, the light emitting layers 34, and the second GaN layers 36 are grown, for example, under the condition that the diameter thereof does not increase with distance toward the upper side. In the example shown in FIG. 3, the columnar sections 30 have a fixed diameter in the lamination direction.

The low refractive index section 40 is formed between the first GaN layers 32 of adjacent columnar sections 30 and between the light emitting layers 34 of adjacent columnar sections 30, as shown in FIG. 1. The low refractive index section 40 is the second AlGaN layer 422. The low refractive index section 40 is formed by lateral epitaxial growth (lateral growth). An AlGaN layer tends to laterally grow as compared with a GaN layer. Examples of the epitaxial growth method may include the MOCVD and MBE methods. The low refractive index section 40 can thus be formed with no gap between the first GaN layers 32 of adjacent columnar sections 30 and between the light emitting layers 34 of adjacent columnar sections 30.

The p-type AlGaN layer 421 is then epitaxially grown on the low refractive index sections 40. Examples of the epitaxial growth method may include the MOCVD and MBE methods. The second AlGaN layer 422, which is the low refractive index section 40, and the first AlGaN layer 421 can be successively grown in a single apparatus, for example, only by switching a gas to another.

The second electrode 52 is then formed on the first AlGaN layer 421. The first electrode 50 is then formed on the buffer layer 22. The first electrode 50 and the second electrode 52 are formed, for example, in vacuum evaporation. The order in accordance with which the first electrode 50 and the second electrode 52 are formed is not limited to a specific order.

The light emitting apparatus 100 can be manufactured by carrying out the steps described above.

3. Variation of Light Emitting Apparatus

Figure 4:
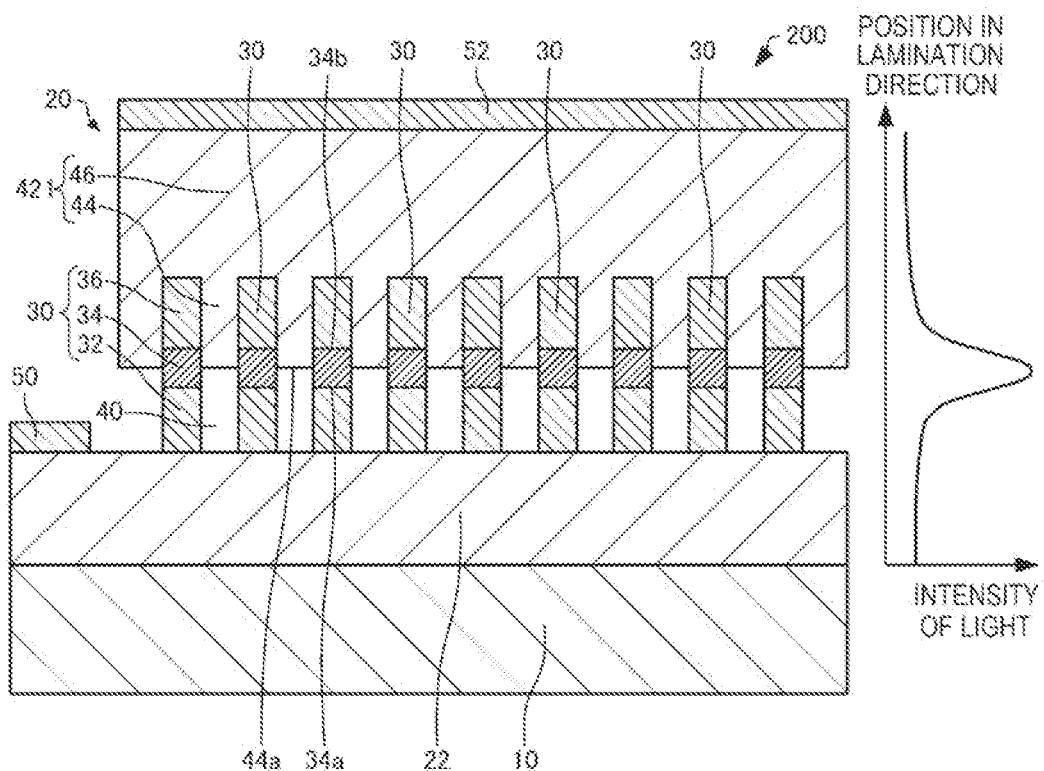
FIG. 4 is a cross-sectional view diagrammatically showing a light emitting apparatus according to a variation of the present embodiment.

A light emitting apparatus according to a variation of the present embodiment will next be described with reference to the drawings. FIG. 4 is a cross-sectional view diagrammatically showing a light emitting apparatus 200 according to the variation of the present embodiment. In the following description of the light emitting apparatus 200 according to the variation of the present embodiment, a member having the same function as that of a constituent member of the light emitting apparatus 100 according to the present embodiment described above have the same reference character and will not be described in detail.

In the light emitting apparatus 100 described above, the low refractive index section 40 is the second AlGaN layer 422, as shown in FIG. 1.

In contrast, in the light emitting apparatus 200, the low refractive index section 40 is an air gap, as shown in FIG. 4. Therefore, in the light emitting apparatus 200, the average refractive index of the first GaN layers 32 in the in-plane direction can be lowered as compared with the case where the low refractive index section 40 is the second AlGaN layer 422.

When the low refractive index section 40 is an air gap, however, the average refractive index of the first GaN layers 32 in the in-plane direction is too small in some cases, and the peak of the optical intensity of the light produced in the light emitting layers 34 therefore shifts from the position of the light emitting layers 34 toward the surface 10. In such a case, it is conceivable to increase the Al concentration in the first AlGaN layer 421 to lower the average refractive index of the first AlGaN layer 421 in the in-plane direction. Increasing the Al concentration in the first AlGaN layer 421, however, lowers the electrical conductivity of the first AlGaN layer 421. It is therefore preferable that the low refractive index section 40 is the second AlGaN layer 422, as in the light emitting apparatus 100, in consideration of the electrical conductivity of the first AlGaN layer 421. For example, assuming that the second AlGaN layer 422 is made of $Al_yGa_{1-y}N$, x and y may satisfy x>y. In consideration of the average refractive index in the in-plane direction, x and y may satisfy x<y.

Further, in the light emitting layer 200, the end 44a of the first section 44 of the first AlGaN layer 421, which is the end facing the substrate 10, is located between the end 34a of each of the light emitting layers 34, which is the end facing the substrate 10, and the end 34b of each of the light emitting layers 34, which is the end facing the second electrode 52, in the lamination direction. Therefore, in the light emitting apparatus 200, the average refractive index of the light emitting layers 34 in the in-plane direction can be increased as compared with a case where the end 44a of the first section 44 coincides with the end 34b of each of the light emitting layers 34 in the lamination direction and the side surface of each of the light emitting layers 34 is exposed. Further, a possibility of occurrence of non-light-emittable recombination at the side surface of each of the light emitting layers 34 can be lowered.

The light emitting apparatus 200 can be formed, for example, by forming a mask layer that is not shown in a position between the first GaN layers 32 of adjacent columnar sections 30, laterally growing the first AlGaN layer 421, and then removing the mask layer.

4. Projector

Figure 5:
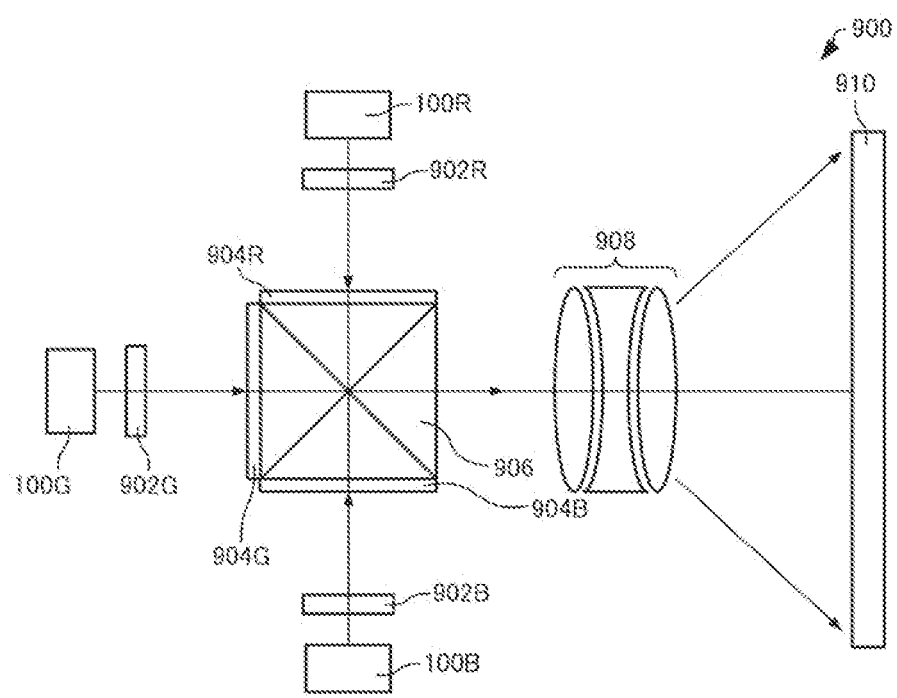
FIG. 5 diagrammatically shows a projector according to the present embodiment.

A projector according to the present embodiment will next be described with reference to the drawings. FIG. 5 diagrammatically shows a projector 900 according to the present embodiment.

The projector 900 includes, for example, the light emitting apparatus 100 as a light source.

The projector 900 includes an enclosure that is not shown and a red light source 100R, a green light source 100G, and a blue light source 100B, which are provided in the enclosure and emit red light, green light, and blue light, respectively. In FIG. 5, the red light source 100R, the green light source 100G, and the blue light source 100B are simplified for convenience.

The projector 900 further includes a first optical element 902R, a second optical element 902G, a third optical element 902B, a first light modulator 904R, a second light modulator 904G, a third light modulator 904B, and a projection apparatus 908. The first light modulator 904R, the second light modulator 904G, and the third light modulator 904B are, for example, each a transmissive liquid crystal light valve. The projection apparatus 908 is, for example, a projection lens.

The light outputted from the red light source 100R enters the first optical element 902R. The light outputted from the red light source 100R is collected by the first optical element 902R. The first optical element 902R may have another function in addition to the light collection function. The same holds true for the second optical element 902G and the third optical element 902B, which will be described later.

The light collected by the first optical element 902R is incident on the first light modulator 904R. The first light modulators 904R modulates the light incident thereon in accordance with image information. The projection apparatus 908 then enlarges an image formed by the first light modulator 904R and projects the enlarged image on a screen 910.

The light outputted from the green light source 100G enters the second optical element 902G. The light outputted from the green light source 100G is collected by the second optical element 902G.

The light collected by the second optical element 902G is incident on the second light modulator 904G. The second light modulator 904G modulates the light incident thereon in accordance with image information. The projection apparatus 908 enlarges an image formed by the second light modulator 904G and projects the enlarged image on the screen 910.

The light outputted from the blue light source 100B enters the third optical element 902B. The light outputted from the blue light source 100B is collected by the third optical element 902B.

The light collected by the third optical element 902B is incident on the third light modulator 904B. The third light modulator 904B modulates the light incident thereon in accordance with image information. The projection apparatus 908 enlarges an image formed by the third light modulator 904B and projects the enlarged image on the screen 910.

The projector 900 can include a cross dichroic prism 906, which combines the light fluxes having exited out of the first light modulator 904R, the second light modulator 904G, and the third light modulator 904B with one another and guides the combined light to the projection apparatus 908.

The three color light fluxes modulated by the first light modulator 904R, the second light modulator 904G, and the third light modulator 904B enter the cross dichroic prism 906. The cross dichroic prism 906 is formed by bonding four right-angle prisms to each other, and a dielectric multilayer film that reflects the red light flux and a dielectric multilayer film that reflects the blue light flux are disposed on the inner surfaces of the combined prisms. The dielectric multilayer films combine the three color light fluxes with one another to form light carrying a color image. The combined light is then projected by the projection apparatus 908 on the screen 910, whereby an enlarged image is displayed.

The red light source 100R, the green light source 100G, and the blue light source 100B may instead directly form video images without use of the first light modulator 904R, the second light modulator 904G, or the third light modulator 904B by controlling the light emitting apparatuses 100 as the pixels of the video images in accordance with the image information. The projection apparatus 908 may then enlarge and project the video images formed by the red light source 100R, the green light source 100G, and the blue light source 100B on the screen 910.

In the example described above, transmissive liquid crystal light valves are used as the light modulators, and light valves based on any other technology other than the liquid crystal technology or reflective light valves may be used. Examples of such light valves may include reflective liquid crystal light valves and digital micromirror devices. The configuration of the projection apparatus is changed as appropriate in accordance with the type of the light valves to be used.

The present disclosure is also applicable to a light source apparatus of a scanning-type image display apparatus including a scanner that is an image formation apparatus that displays an image having a desired size on a display surface by scanning the screen with the light from the light source.

The light emitting apparatus according to the embodiment described above can be used in another application in addition to a projector. Examples of the application other than a projector may include an indoor or outdoor illuminator, a backlight of a display, a laser printer, a scanner, an in-vehicle light, a headlamp of an automobile, a sensing instrument using light, and a light source of a communication instrument.

The embodiment and the variation described above are presented by way of example, and the present disclosure is not limited thereto. For example, the embodiment and the variation can be combined with each other as appropriate.

The present disclosure encompasses substantially the same configuration as the configuration described in the embodiment, for example, a configuration having the same function, using the same method, and providing the same result or a configuration having the same purpose and providing the same effect. Further, the present disclosure encompasses a configuration in which an inessential portion of the configuration described in the embodiment is replaced. Moreover, the present disclosure encompasses a configuration that provides the same effects and advantages as those provided by the configuration described in the embodiment or a configuration that can achieve the same purpose as that achieved by the configuration described in the embodiment. Further, the present disclosure encompasses a configuration in which a known technology is added to the configuration described in the embodiment.

The following contents are derived from the embodiment and the variation described above.

An aspect of the light emitting apparatus includes a substrate, a laminated structure provided at the substrate and including a plurality of columnar sections, and an electrode provided on the side opposite the substrate with respect to the laminated structure and injecting current into the laminated structure. The columnar sections each include an n-type first GaN layer, a p-type second GaN layer, and a light emitting layer provided between the first GaN layer and the second GaN layer. The first GaN layers are provided between the light emitting layers and the substrate. The laminated structure includes a p-type first AlGaN layer. The first AlGaN layer includes a first section provided between the second GaN layers of the columnar sections adjacent to each other and a second section provided between the first section and the electrode and between the columnar sections and the electrode.

According to the light emitting apparatus, the light can be confined in the light emitting layer as compared, for example, with the case where the second section is formed of a GaN layer. The light emitting apparatus can therefore reduce loss of the amount of light that leaks toward the electrode and is absorbed by the electrode.

In the aspect of the light emitting apparatus, the laminated structure may include a low refractive index section between the first GaN layers of the columnar sections adjacent to each other, the low refractive index section having a refractive index lower than that of the first GaN layers.

According to the light emitting apparatus, the average refractive index of the first GaN layers in the in-plane direction can be lowered as compared with the case where a layer having a refractive index equal to that of the first GaN layers is provided between the first GaN layers of adjacent columnar sections.

In the aspect of the light emitting apparatus, the low refractive index section may be a second AlGaN layer.

According to the light emitting apparatus, a p-type AlGaN layer can be readily formed, for example, only by switching a gas to another.

In the aspect of the light emitting apparatus, an end of the first section that is the end facing the substrate may be located between an end of each of the light emitting layers that is the end facing the substrate and an end of each of the light emitting layers that is the end facing the electrode in the lamination direction in which the first GaN layers and the light emitting layers are laminated on each other.

According to the light emitting apparatus, the average refractive index of the light emitting layers in the in-plane direction can be increased as compared with the case where the end of the first section that is the end facing the substrate coincides with the end of each of the light emitting layers that is the end facing the electrode in the lamination direction and the side surface of each of the light emitting layers is exposed.

An aspect of a projector has the aspect of the light emitting apparatus.

What is claimed is:

1. A light emitting apparatus comprising:
    a substrate;
    a laminated structure provided at the substrate and including a plurality of columnar sections; and
    an electrode provided on a side opposite the substrate with respect to the laminated structure and injecting current into the laminated structure,
    wherein the columnar sections each include
    an n-type first GaN layer,
    a p-type second GaN layer, and
    a light emitting layer provided between the n-type first GaN layer and the p-type second GaN layer,
    the n-type first GaN layers are provided between the light emitting layers and the substrate,
    the laminated structure includes a p-type first AlGaN layer, and
    the p-type first AlGaN layer includes
    a first section provided between the p-type second GaN layers of the columnar sections adjacent to each other,
    a second section provided between the first section and the electrode and between the columnar sections and the electrode, and
    an entirety of each of the n-type first GaN layer, the light emitting layer, and the p-type second GaN layer are axially aligned in a direction from the substrate to the electrode.

2. The light emitting apparatus according to claim 1, wherein the laminated structure includes a low refractive index section between the n-type first GaN layers of the columnar sections adjacent to each other, the low refractive index section having a refractive index lower than a refractive index of the n-type first GaN layers.

3. The light emitting apparatus according to claim 2, wherein the low refractive index section is a second AlGaN layer.

4. The light emitting apparatus according to claim 1, wherein an end of the first section that is an end facing the substrate is located between an end of each of the light emitting layers that is an end facing the substrate and an end of each of the light emitting layers that is an end facing the electrode in a lamination direction in which the n-type first GaN layers and the light emitting layers are laminated on each other.

5. A projector comprising the light emitting apparatus according to claim 1.

6. A light emitting apparatus comprising:
    a substrate;
    a laminated structure provided at the substrate and including a plurality of columnar sections; and
    an electrode provided on a side opposite the substrate with respect to the laminated structure and injecting current into the laminated structure,
    wherein the columnar sections each include
    an n-type first GaN layer,
    a p-type second GaN layer, and
    a light emitting layer provided between the n-type first GaN layer and the p-type second GaN layer,
    the n-type first GaN layers are provided between the light emitting layers and the substrate,
    the laminated structure includes a p-type first AlGaN layer, and
    the p-type first AlGaN layer includes
    a first section provided between the p-type second GaN layers of the columnar sections adjacent to each other, the first section directly contacting the light emitting layers of the columnar sections, and
    a second section provided between the first section and the electrode and between the columnar sections and the electrode.

* * * * *